United States Patent [19]
Jang

[11] Patent Number: 5,337,277
[45] Date of Patent: Aug. 9, 1994

[54] ROW REDUNDANCY CIRCUIT FOR A SEMICONDUCTOR MEMORY DEVICE

[75] Inventor: Hyun-Soon Jang, Seoul, Rep. of Korea

[73] Assignee: SamSung Electronics Co., Ltd., Suwon, Rep. of Korea

[21] Appl. No.: 942,450

[22] Filed: Sep. 9, 1992

[30] Foreign Application Priority Data

Mar. 9, 1992 [KR] Rep. of Korea ............... 1992-3841

[51] Int. Cl.$^5$ .................................................. G11C 7/00
[52] U.S. Cl. ................................. 365/200; 365/225.7; 371/10.1; 371/10.3
[58] Field of Search ................ 365/200, 225.7; 371/10.1, 10.3

[56] References Cited

U.S. PATENT DOCUMENTS

| | | | |
|---|---|---|---|
| 4,342,005 | 7/1982 | Harford | 330/254 |
| 4,464,632 | 8/1984 | Yoshihisa et al. | 330/254 |
| 4,992,984 | 2/1991 | Busch et al. | 365/200 |

FOREIGN PATENT DOCUMENTS 2188501 9/1987 United Kingdom.

*Primary Examiner*—Eugene R. LaRoche
*Assistant Examiner*—Andrew Tran
*Attorney, Agent, or Firm*—Robert E. Bushnell

[57] ABSTRACT

A row redundancy circuit for repairing a defective cell of a memory cell array in a semiconductor memory device comprising an address selector 300 for receiving two or more of address bit pairs, of an address bit pair group, designating the defective cell to selectively output one of the two or more address bit pairs, a fuse box 100 for storing the information of the remaining address bits of the address bit pair group, except the address bits of the selected address bit pair output by the address selector, and at least a redundant decoder 200, 200A for decoding the output signals of the address selector and fuse box, thereby maximizing the row redundancy efficiency.

13 Claims, 4 Drawing Sheets

FIG. 5

ROW REDUNDANCY CIRCUIT FOR A SEMICONDUCTOR MEMORY DEVICE

BACKGROUND OF THE INVENTION

The present invention relates to a semiconductor memory device, and more particularly to a row redundancy circuit for replacing a defective cell present in a row of a normal memory cell array with a spare cell.

Generally, a semiconductor memory device is provided with a row redundancy circuit to replace a defective memory cell of a normal memory cell array with a spare cell by decoding the row address designating the defective cell. The spare or redundant cell array comprising the spare or redundant memory cells is arranged adjacent to the normal cell array along with decoders for decoding the addresses and selecting the redundant cells.

Each of the minimum array blocks with corresponding sense amplifier groups is usually provided with the respective spare cell array. The number of the minimum array blocks in a single chip tends to be increased as the complexity of the chip increases so as to prevent the operating current drop which is caused by the reduction of the activation of the array. Most of the word line fails are usually caused by so-called cross fail such as bridge between two adjacent word lines. In order to cope with such cross fail, the row redundancy circuit employs a row redundancy set comprising two word lines so as to simultaneously repair the two failing word lines. The two adjacent word lines are defined by least significant bit (LSB) of the row address as the internal signal. The repairing operation is usually accomplished by storing the information of the remaining bits except LSB into the fuse box.

A conventional row redundancy circuit are shown in a block diagram of FIG. 1. The output signals of the row redundant decoders 200 and 200A are respectively connected to the spare word lines SWL1 and SWL2. The signal φX is applied to the row redundant decoders 200 and 200A. The row address signals RA1-RA7 except the LSB RA0 are all transferred to the fuse box 100. The row address signals RA0 and $\overline{RA0}$ as LSBs control the row redundant decoders 200 and 200A so as to cut the fuse of the fuse box 100 by using only the information of RA1-RA7 among the row address bits designating the defective memory cell.

Thus, the repairing is possible only when the two adjacent word lines have the same RA1-RA7 and different RA0, so that the repairing probability is only 50%. For example, when there is provided a row redundancy set for each of the minimum array blocks, it is impossible to repair two adjacent word lines pair when a failing occurs between two adjacent word lines pairs divided by LSB. Hence this causes the reduction of the repairing probability to 50% as well as yield of the chips. If there are provided at least two row redundancy sets for each of the minimum array blocks in order to resolve the above problem, the chip areas occupied by the redundant cells and thus the chip size are considerably increased.

SUMMARY OF THE INVENTION

It is an object of the present invention to provide a row redundancy circuit for maximizing the repairing probability of the chip.

It is another object of the present invention to provide a row redundancy circuit, whereby the chip repairing probability is considerably increased even with a single row redundancy set for each of the minimum array blocks in the chip.

According to the present invention, a row redundancy circuit for repairing a defective cell of a memory cell array in a semiconductor memory device comprises an address selector for receiving two or more of address bits designating the defective cell to selectively output one among the two or more address bits, a fuse box for storing the information of the remaining address bits except the output bit selected by the address selector, and at least a redundant decoder for decoding the output signals of the address selector and fuse box, thereby maximizing the row redundancy efficiency.

BRIEF DESCRIPTION OF THE ATTACHED DRAWINGS

For a better understanding of the invention, and to show how the same may be carried into effect, reference will now be made, by way of example, to the accompanying diagrammatic drawings, in which:

FIG. 5 is a table for representing the repairing rate of the inventive row redundancy circuit.

DETAILED DESCRIPTION OF A PREFERRED EMBODIMENT

Figure 2:
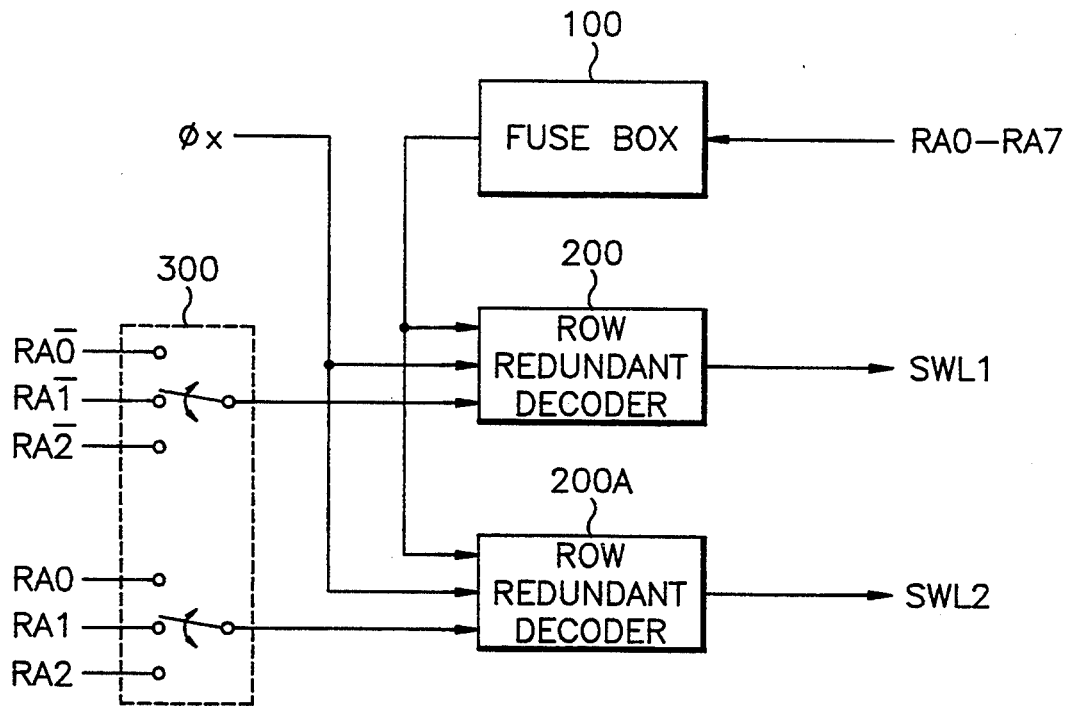
FIG. 2 is a block diagram of a row redundancy circuit according to the present invention.

Referring to FIG. 2, the inventive row redundancy circuit comprises an address selector 300, fuse box 100 and redundant decoders 200 and 200A. The address selector 300 is to receive two or more of address bits (in this case three bits) designating the defective cell to selectively output one among the two or more address bits. The fuse box 100 is to store the information of the remaining address bits except the output bit selected at the address selector 300. The redundant decoders 200 and 200A are to decode the output signals of the address selector 300 and fuse box.

Figure 5:
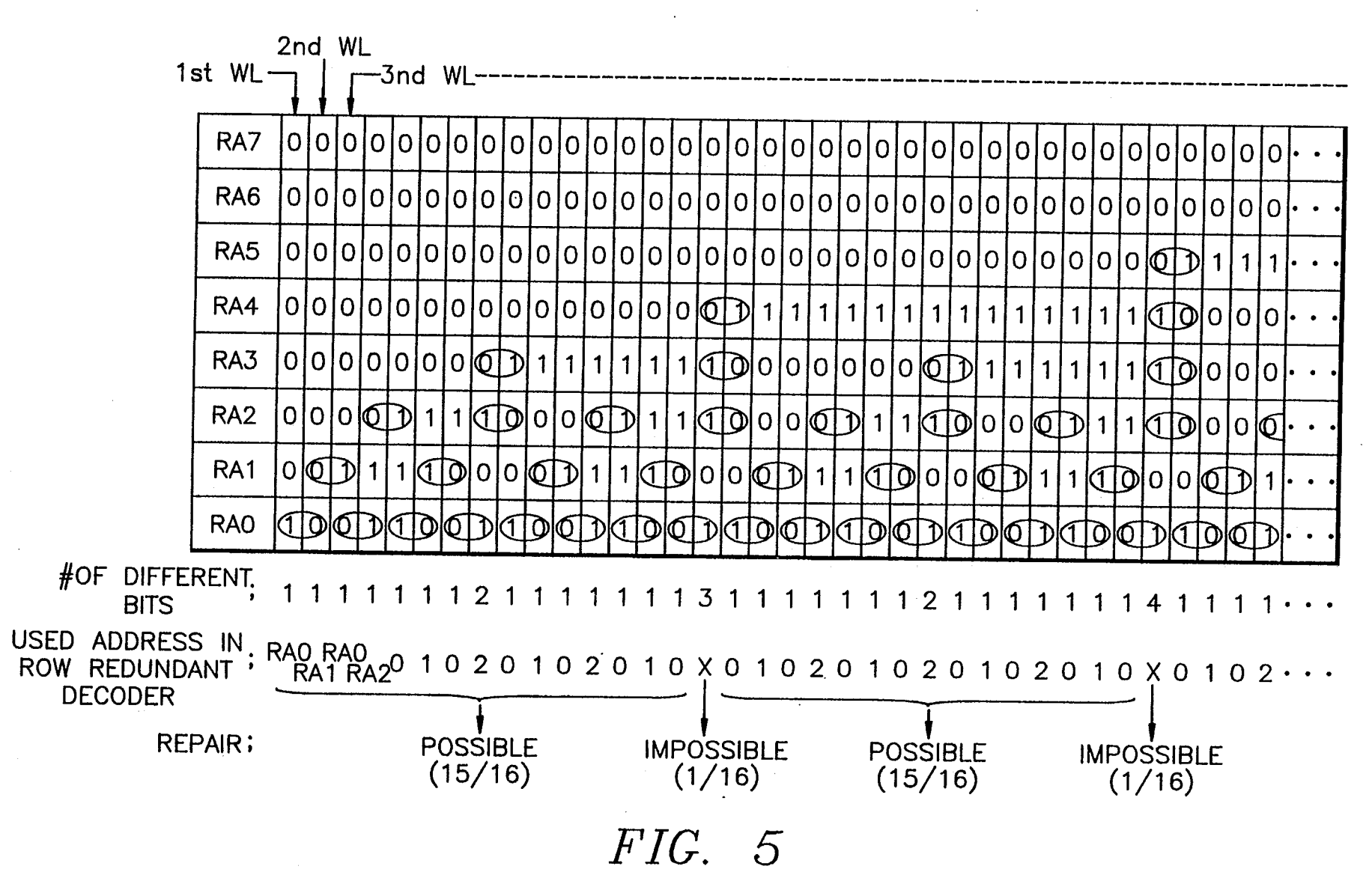

The fuse box 100 receives row addresses RA0-RA7. The address selector 300 selects one of the three input row addresses RA0-RA2. As shown in FIG. 2, all the addresses RA0-RA7 are applied to the fuse box 100, and moreover one of the addresses RA1 and RA2 is selectively input to the redundant decoders 200 and 200A together with the address RA0 of LSB, thereby increasing the repairing probability. Namely, as shown in FIG. 5, two adjacent word lines have two or more different bits once in every eight word lines and three or more different bits once in every sixteen word lines.

If the adjacent word lines have one different bit, in the address selector, one of the addresses RA0, RA1 and RA2 is selectively input to the row redundant decoder 200 in response to the different bit, and the row addresses except the selected bit at the address selector is input to the fuse box, thus performing the repairing operation. If the adjacent word lines have two different bits, the different bits are always RA2 and RA3 and therefore the address RA2 is selected input to the row redundant decoders 200 and 200A, and the remaining addresses to the fuse box 100, thus performing the repairing. If three or more bits are different, the fuse box 100 should cover too many cases to perform the repairing operation. Therefore, as shown in FIG. 5, the inventive row redundant circuit achieves the repairing probability of at least 93% (i.e., (15/16)×100%) even with a single redundancy set for each of the minimum array blocks.

Figure 3:
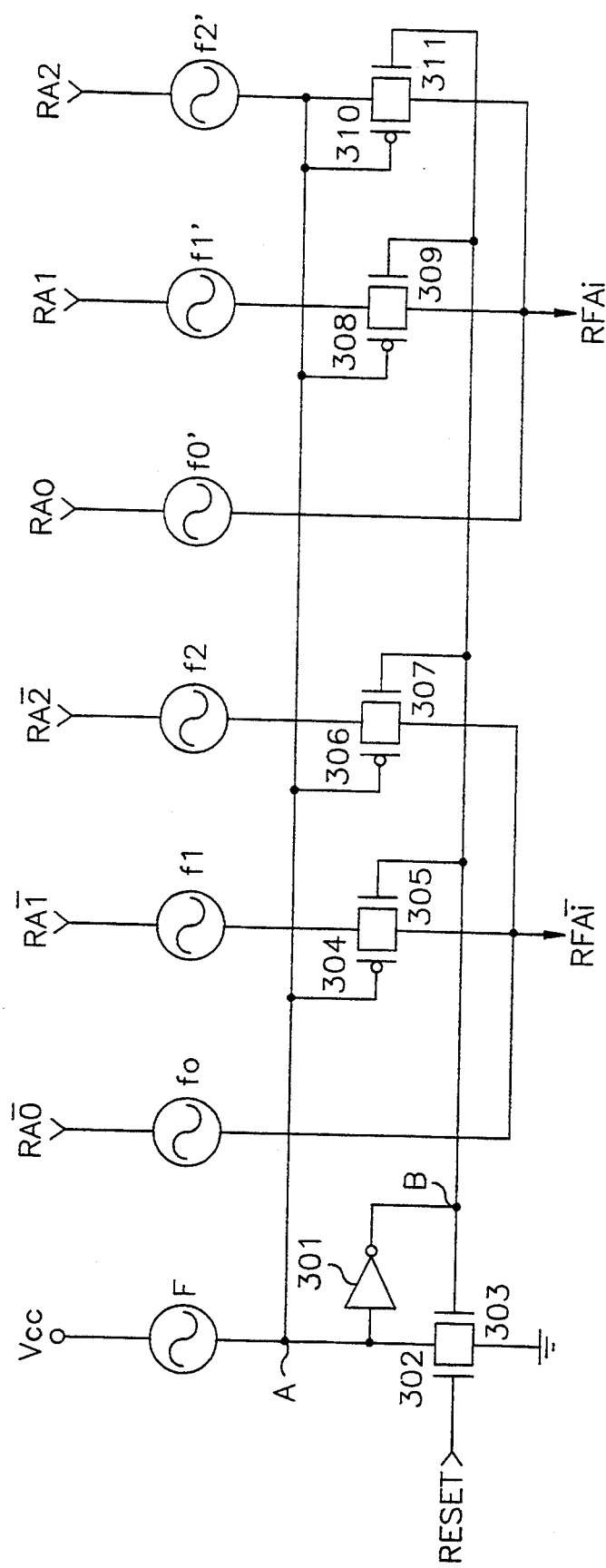
FIG. 3 is a block diagram of an address selector according to an embodiment of the present invention.

In operation, the address selector 300 is enabled by cutting the enable fuse F (nodes A and B respectively take low and high levels), as shown in FIG. 3. Detecting the defective address in chip test, four of the fuses of the address selector 300 among the fuses f0, f1, f2, f0', f1' and f2' for addresses RA0, $\overline{RA0}$, RA1, $\overline{RA1}$, RA2, $\overline{RA2}$, and the enable fuse F are cut. Therefore one of the addresses RA0, RA1, RA2 which is not cut is applied to the row redundant decoder. In addition, the reset clock RESET determines the state of the nodes A and B.

Figure 4:
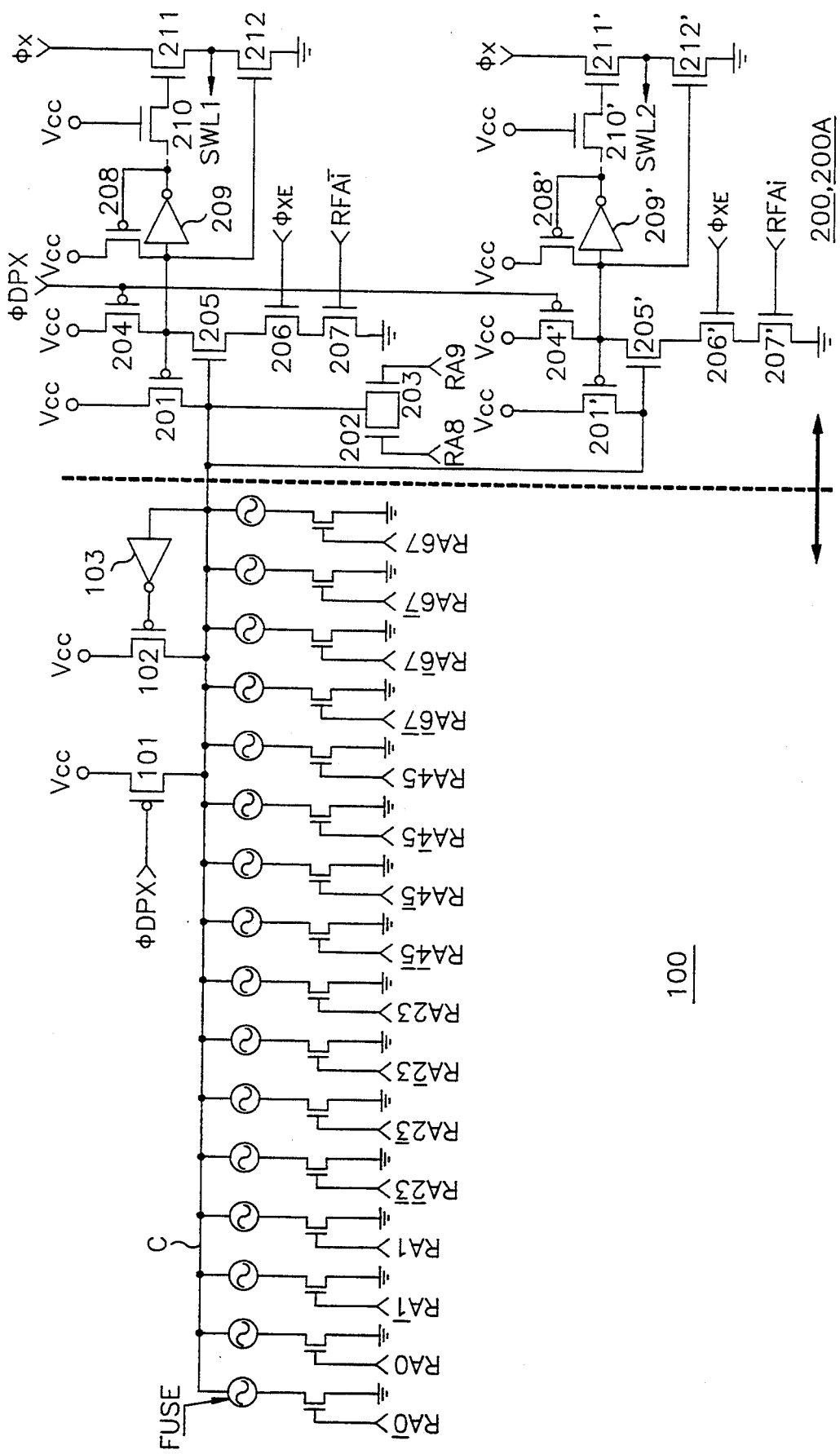
FIG. 4 is a schematic circuit diagram of a fuse box and row redundant decoder according to an embodiment of the present invention.

Referring to FIG. 4 for showing the fuse box and row redundant decoders, the fuse box 100 cuts a pair fuse for RAi and $\overline{RAi}$ which are the selected addresses in the address selector of FIG. 3. And desired ones of the remaining fuses are cut according to the address of the defective cell, thereby effectively, storing the row address of the defective cell. The outputs of the address selector 300 and the fuse box 100 are applied to the row redundant decoders 200 and 200A. The node C is precharged with the source voltage VCC by means of the pre-charge clock signal $\phi$DPX. The row redundant decoders 200 and 200A pass to the spare word line SWL1 or SWL2 the signal $\phi$X that is input to the word line drivers 211, 212, 211', 212' under the control of the output RFAi and $\overline{RFAi}$ of the address selector 300, output information of the fuse box 100, and the row redundant decoder enable clock signal $\phi$XE. Hence, the redundancy operation of the chip is readily achieved.

Figure 1:
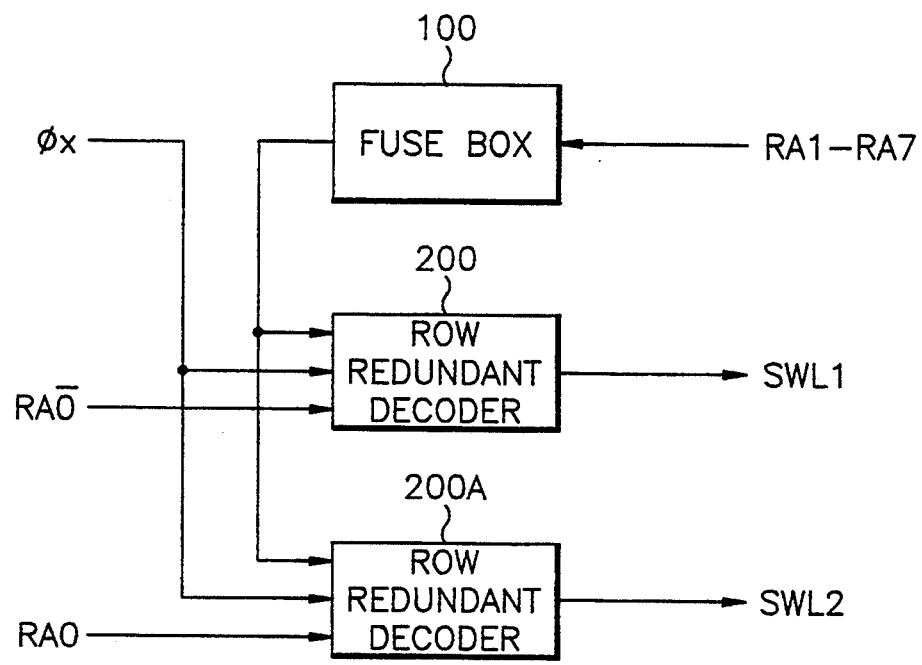
FIG. 1 is a block diagram of a conventional row redundancy circuit.

Although the circuit of FIGS. 3 and 4 is a preferred embodiment of FIG. 2, it may be embodied in a variety of ways. Even though the address selector is made to select of two bits, the redundancy efficiency may be considerably increased compared to the prior art of FIG. 1. However, it should be noted that the maximum efficiency is achieved by selecting of three bits.

As stated above, the inventive circuit achieves the repairing probability of at least 93% for row or word line fail even with a single redundancy set for each of the minimum array blocks, thus preventing the chip size from being increased and the yield from being reduced.

While the invention has been particularly shown and described with reference to the preferred embodiment thereof, it will be apparent to those who are skilled in the art that in the foregoing changes in form and detail may be made without departing from the spirit and scope of the present invention.

What is claimed is:

1. A semiconductor memory device with a row redundancy circuit for repairing a defective cell of a memory cell array, said row redundancy circuit comprising:
    an address selector for receiving at least two address bit pairs designating said defective cell and for selecting one of said at least two address bit pairs;
    a fuse box for receiving an address bit pair group and for storing the information of each address bit pair of said address bit pair group except the address bit pair selected by said address selector; and
    row redundant decoder means, coupled to said address selector and said fuse box, for receiving and decoding the address bit pairs output from said address selector and said fuse box, so as to maximize row redundancy efficiency.

2. A semiconductor memory device as claimed in claim 1, wherein said address selector receives three address bit pairs designating said defective memory cell for selection, and for selecting one address bit pair among said three address bit pairs.

3. A semiconductor memory device as claimed in claim 1, wherein said address selector comprises a plurality of fuse means, each fuse means of said plurality of fuse means being connected to a corresponding address bit of said address bit pairs received by said address selector.

4. A semiconductor memory device as claimed in claim 3, further comprising a voltage source connected to one of said plurality of fuse means.

5. A semiconductor memory device as claimed in claim 2, wherein said address selector comprises a plurality of fuses, one of said plurality of fuses being connected to a voltage source and each remaining fuse of said plurality of fuses being connected to a respective address bit of said three address bit pairs.

6. A semiconductor memory device as claimed in claim 2, wherein said fuse box comprises a plurality of fuses, each fuse of said fuse box being connected to a corresponding address bit of said address bit pair group.

7. A semiconductor memory device as claimed in claim 5, wherein said fuse box comprises a corresponding fuse for each address bit of said address bit pair group, and each fuse of said fuse box is connected to a corresponding address bit of said address bit pair group.

8. A row redundancy circuit for repairing a defective memory cell of a memory cell array in a semiconductor memory device having row redundant decoder means, said row redundancy circuit comprising:
    first means comprising a first plurality of fuse pairs connected to a first plurality of address bit pairs, said first means for storing, for output to said row redundant decoder means, address information of said defective memory cell; and
    second means comprising a second plurality of fuse pairs respectively connected to a second plurality of address bit pairs, said first plurality of address bit pairs comprising said second plurality of address bit pairs, said second means for selecting, for output to said row redundant decoder means, one address bit pair of said second plurality of address bit pairs.

9. The circuit as claimed in claim 8, wherein said first plurality is at least eight and said second plurality is at least two.

10. The circuit as claimed in claim 8, wherein said first plurality is at least eight and said second plurality is at least three.

11. A row redundancy circuit for repairing a defective memory cell of a memory cell array in a semiconductor memory device having row redundant decoder means, said row redundancy circuit comprising:
    a fuse box comprising a first plurality of fuse pairs connected to a first plurality of address bit pairs, said fuse box for storing, for output to said row redundant decoder means, address information of said defective memory cell; and
    an address selector comprising a second plurality of fuse pairs respectively connected to a second plurality of address bit pairs, said first plurality of address bit pairs comprising said second plurality of address bit pairs, said address selector for selecting, for output to said row redundant decoder means, one address bit pair of said second plurality of address bit pairs.

12. The circuit as claimed in claim 11, wherein said first plurality is at least eight and said second plurality is at least two.

13. The circuit as claimed in claim 11, wherein said first plurality is at least eight and said second plurality is at least three.

* * * * *